US010617025B1

(12) United States Patent
Chen et al.

(10) Patent No.: US 10,617,025 B1
(45) Date of Patent: Apr. 7, 2020

(54) HEAD-MOUNTED DISPLAY DEVICE

(71) Applicant: Quanta Computer Inc., Taoyuan (TW)

(72) Inventors: Chun-Lung Chen, Taoyuan (TW);
Yuan-Peng Yu, Taoyuan (TW);
Hung-Chieh Wu, Taoyuan (TW);
Feng-Shih Lin, Taoyuan (TW);
Chi-Chang Yu, Taoyuan (TW);
Chia-Hsing Shih, Taoyuan (TW);
Shen-Her Wang, Taoyuan (TW)

(73) Assignee: QUANTA COMPUTER INC, Taoyuan (TW)

( * ) Notice: Subject to any disclaimer, the term of this patent is extended or adjusted under 35 U.S.C. 154(b) by 0 days.

(21) Appl. No.: 16/352,182

(22) Filed: Mar. 13, 2019

(30) Foreign Application Priority Data

Nov. 6, 2018 (TW) .............................. 107139371 A

(51) Int. Cl.
*H05K 5/00* (2006.01)
*H05K 5/02* (2006.01)

(52) U.S. Cl.
CPC ......... *H05K 5/0217* (2013.01); *H05K 5/0017* (2013.01); *H05K 5/0086* (2013.01)

(58) Field of Classification Search
CPC ... H05K 5/0217; H05K 5/0017; H05K 5/0086
See application file for complete search history.

(56) References Cited

U.S. PATENT DOCUMENTS

| 9,733,482 | B2 * | 8/2017 | West | G02B 27/0176 |
| 10,261,579 | B2 * | 4/2019 | Wang | G02B 27/0172 |
| 10,353,206 | B2 * | 7/2019 | Guo | G02B 27/0176 |
| 2011/0273662 | A1 * | 11/2011 | Hwang | G02B 27/0176 |
| | | | | 351/158 |

FOREIGN PATENT DOCUMENTS

| CN | 104503586 | 12/2014 |
| CN | 207202177 | 9/2017 |
| CN | 208044199 | 3/2018 |

\* cited by examiner

*Primary Examiner* — Rockshana D Chowdhury

(57) ABSTRACT

A head-mounted display device includes a wearable device, a display module, a fixing rack and a connecting rod module. The wearable device is used to be placed on a human head. The display module is used to cover human eyes. The fixing rack is fixedly connected to the wearable device. The connecting rod module includes a support arm and a sliding member. The support arm is pivotally connected to the fixing rack. The sliding member is fixedly connected to the display module, and slidably engaged with the support arm and the fixing rack.

9 Claims, 8 Drawing Sheets

HEAD-MOUNTED DISPLAY DEVICE

RELATED APPLICATIONS

This application claims priority to Taiwan Application Serial Number 107139371, filed Nov. 6, 2018, which is herein incorporated by reference.

BACKGROUND

Field of Disclosure

The present disclosure relates to a display device. More particularly, the present disclosure relates to a head-mounted display device.

Description of Related Art

With the improvement of technology, a head-mounted display device for virtual reality (VR) has been launched to the free marketplace. A user wearing the head-mounted display device can watch a virtual world of three-dimensional space reproduced by computer simulation through the head-mounted display device, and when the user turns, a new virtual-image field in the virtual world of the three-dimensional space can be instantly provided so as to enhance a real-world viewing experience of the user.

However, when the user wearing the head-mounted display device would pause to use the head-mounted display device, the user must take off the head-mounted display device away to change the sight line of the user from the virtual vision field to the real vision field. This situation may cause inconvenience to the user, and reduces the users desire to utilize the technology.

SUMMARY

In one embodiment of the disclosure, a head-mounted display device is provided. The head-mounted display device includes a wearable device, a display module, a fixing rack and a connecting rod module. The fixing rack is fixedly connected to the wearable device. The connecting rod module includes a support arm and a sliding member. The support arm is pivotally connected to the fixing rack. The sliding member is fixedly connected to the display module, and slidably engaged with the support arm and the fixing rack.

According to one or more embodiments of the disclosure, in the head-mounted display device, the fixing rack is provided with a rack body, a pivot portion and a first arc-shaped rib. The pivot portion is disposed on one surface of the rack body, and pivotally connected to the support arm. The first arc-shaped rib is disposed on an edge of the rack body, and extends outwards from the surface of the rack body. The sliding member includes a frame body and an extending arm. The frame body is connected to the display module and the extending arm. The extending arm is disposed between the fixing rack and the support arm, and slidably connected to a bottom portion of the first arc-shaped rib. The first arc-shaped rib is used to stop the connecting rod module from rotating relative to the pivot portion.

According to one or more embodiments of the disclosure, in the head-mounted display device, the fixing rack is further provided with a second arc-shaped rib. The second arc-shaped rib is disposed on the surface of the rack body between the first arc-shaped rib and the pivot portion. The rack body, the first arc-shaped rib and the second arc-shaped rib collectively form an arc recess. The sliding member includes a guiding block. The guiding block is disposed on one end of the extending arm opposite to the frame body. When the frame body is slid away from the fixing rack to move the guiding block into the arc recess, the connecting rod module can rotate relative to the fixing rack at this moment.

According to one or more embodiments of the disclosure, in the head-mounted display device, the connecting rod module includes an engaging element and a depressing component. The engaging element includes a strip body and a plurality of position-limited teeth. The strip body is fixedly connected to the support arm. The position-limited teeth are spaced arranged on the strip body in a longitudinal direction of the extending arm. The depressing component includes a suspending arm and a pressing block. The suspending arm is connected to the support arm. The pressing block is connected to the sliding member, slidably disposed between the engaging element and the suspending arm. The pressing block is provided with an engagement interface. When the suspending arm presses the engagement interface of the pressing block and the engagement interface is engaged with at least one of the position-limited teeth, the sliding member is fixed to the support arm.

According to one or more embodiments of the disclosure, in the head-mounted display device, the rack body further includes a sunken portion at the surface of the rack body. The depressing component further includes an elastic member that abuts against the sunken portion and the suspending arm, respectively. When the connecting rod module moves the display module to rotate relative to the fixing rack, the elastic member slides along the sunken portion.

According to one or more embodiments of the disclosure, in the head-mounted display device, the connecting rod module includes a release member. The release member includes a pushing member and a returning member. The pushing member is movably disposed on the sliding member for pushing the engagement interface of the pressing block away from the engaging element. The returning member abuts against the pushing member and the sliding member, respectively.

According to one or more embodiments of the disclosure, in the head-mounted display device, one end of the pushing member is provided with a first guiding inclined surface, and one end of the pressing block is provided with a second guiding inclined surface. The second guiding inclined surface is matched to the first guiding inclined surface and slidably contacts with the first guiding inclined surface directly. The engagement interface of the pressing block is pushed away from the engaging element through the first guiding inclined surface pushing the second guiding inclined surface.

According to one or more embodiments of the disclosure, in the head-mounted display device, the sliding member further includes at least one guiding rail portion. The guiding rail portion is disposed on one side of the frame body, and formed with a guiding slot for the support arm slidably engaging within the guiding slot.

According to one or more embodiments of the disclosure, in the head-mounted display device, the connecting rod module includes a torsion spring element. The torsion spring element is sleeved on the pivot portion to respectively abut against the fixing rack and the support arm for elastically driving the connecting rod module and the display module to rotate.

According to one or more embodiments of the disclosure, in the head-mounted display device, the support arm is further provided with an extending rib that extends towards the fixing rack. The fixing rack is further provided with a stopping flange that is protrusively formed on the surface of the rack body. When the connecting rod module is rotated at a certain angle relative to the fixing rack, the stopping flange interferes with the extending rib for stopping the connecting rod module to continually drive the display module to pivot.

With the structure described in the above embodiments, on one hand, a user may rapidly remove the display module away from the human eyes so as to change the sight line of the user from the virtual vision field to the real vision field, on the other hand, the glasses or skins of the user may avoid being damaged by the collision of the display module. Furthermore, when the user would use the display module again, since the display module can quickly cover the user's human eyes, the user does not need to adjust the wearable device again, so that the preparation time of the user can be reduced, thereby increasing the usage intentions of the user.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
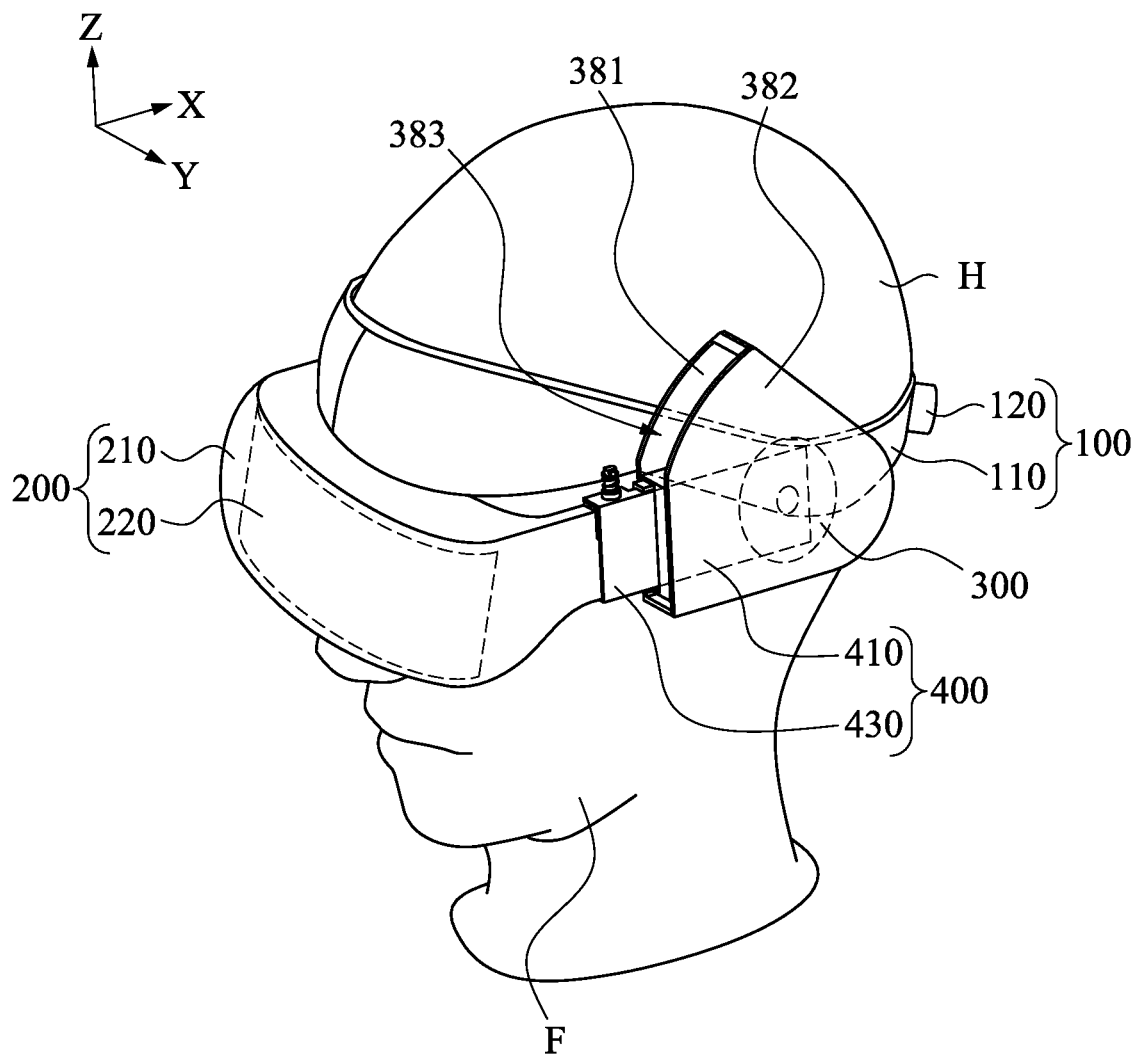
FIG. 1 is a perspective view of a head-mounted display device being worn according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

FIG. 1 is a perspective view of a head-mounted display device 10 being worn according to one embodiment of the disclosure. As shown in FIG. 1, the head-mounted display device 10 includes a wearable device 100, a display module 200, two fixing racks 300 and two connecting rod modules 400. The fixing racks 300 are oppositely arranged on two opposite sides of the display module 200, and respectively fixedly connected to the wearable device 100. The connecting rod modules 400 are oppositely arranged on the opposite sides of the display module 200. Each of the connecting rod modules 400 includes a support arm 410 and a sliding member 430. The support arm 410 is pivotally connected to the fixing rack 300. The sliding member 430 is fixedly connected to the display module 200, and slidably engaged with the support arm 410 and the fixing rack 300. Thus, when a user wears to use the head-mounted display device 10, the wearable device 100 is placed on the human head H of the user, and the display module 200 covers the human eyes of the user (not shown in figures) to in contact with the skin F of the user. The fixing rack 300 is fixedly connected to the wearable device 100. The connecting rod module 400 is used to enable the display module 200 being attached on or removed away from the human eyes so as to change the sight line of the user from the virtual vision field to the real vision field.

Therefore, with the structure described in the above embodiments, on one hand, a user may rapidly remove the display module 200 away from the human eyes so as to change the sight line of the user from the virtual vision field to the real vision field, on the other hand, the glasses or skins of the user may avoid being damaged by the collision of the display module 200. Furthermore, when the user would use the display module again, since the display module 200 can quickly cover the user's human eyes, the user does not need to adjust the wearable device 100 again, so that the preparation time of the user can be reduced, thereby increasing the usage intentions of the user.

Figure 2:
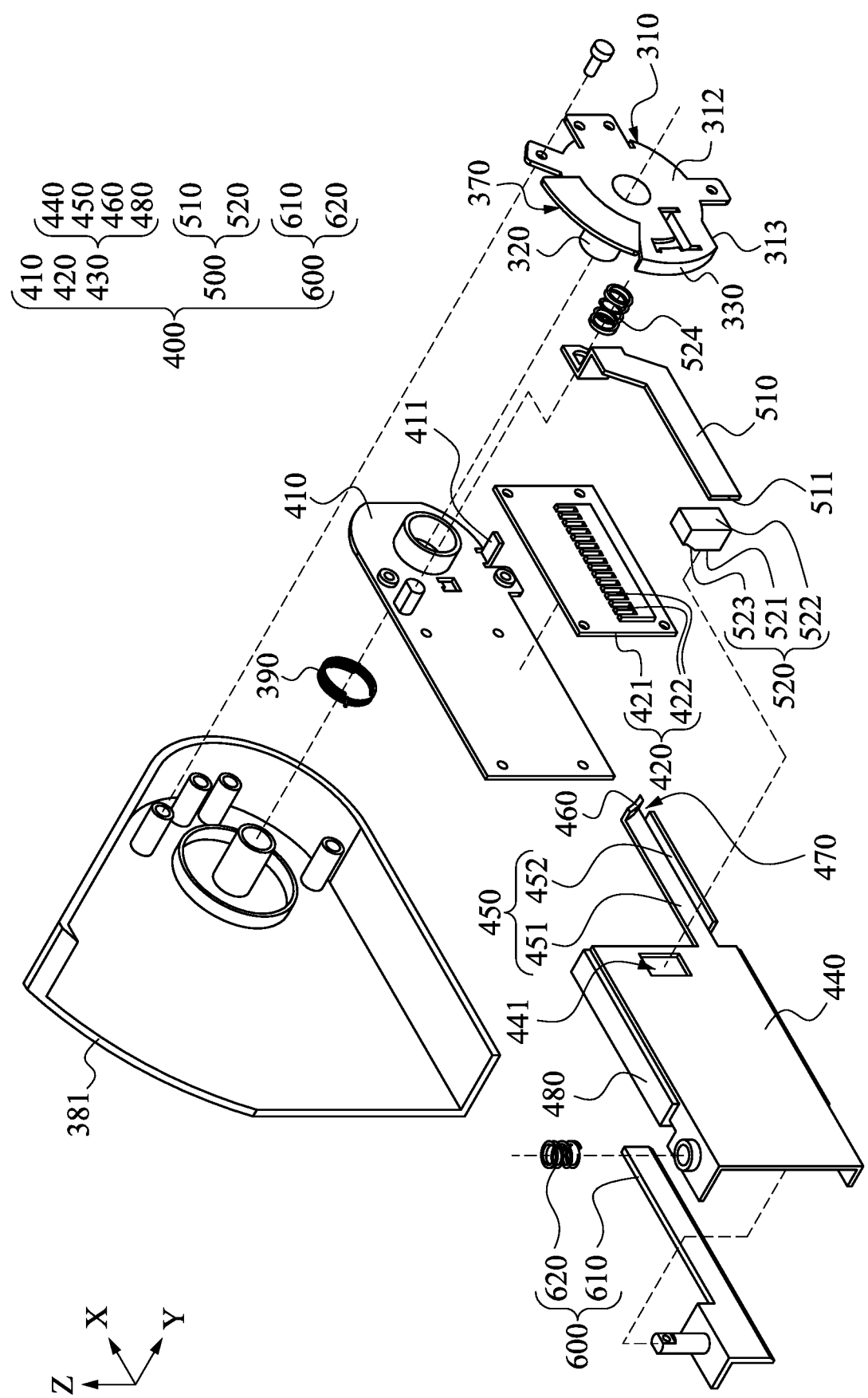
FIG. 2 is an exploded view of the connecting rod module and the fixing rack of FIG. 1 viewed from one perspective.
Figure 3:
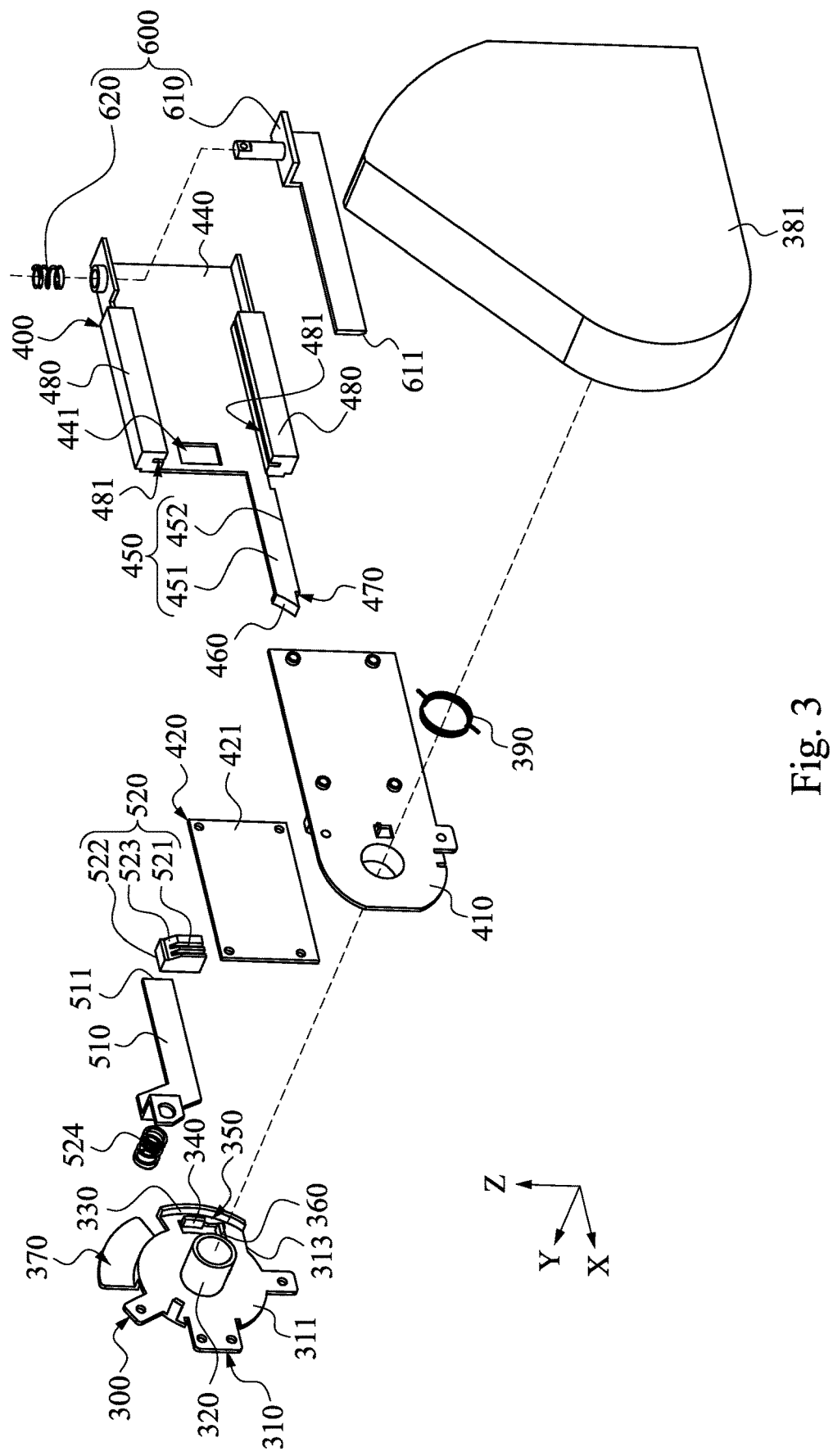
FIG. 3 is an exploded view of the connecting rod module and the fixing rack of FIG. 1 viewed from another perspective.
Figure 4:
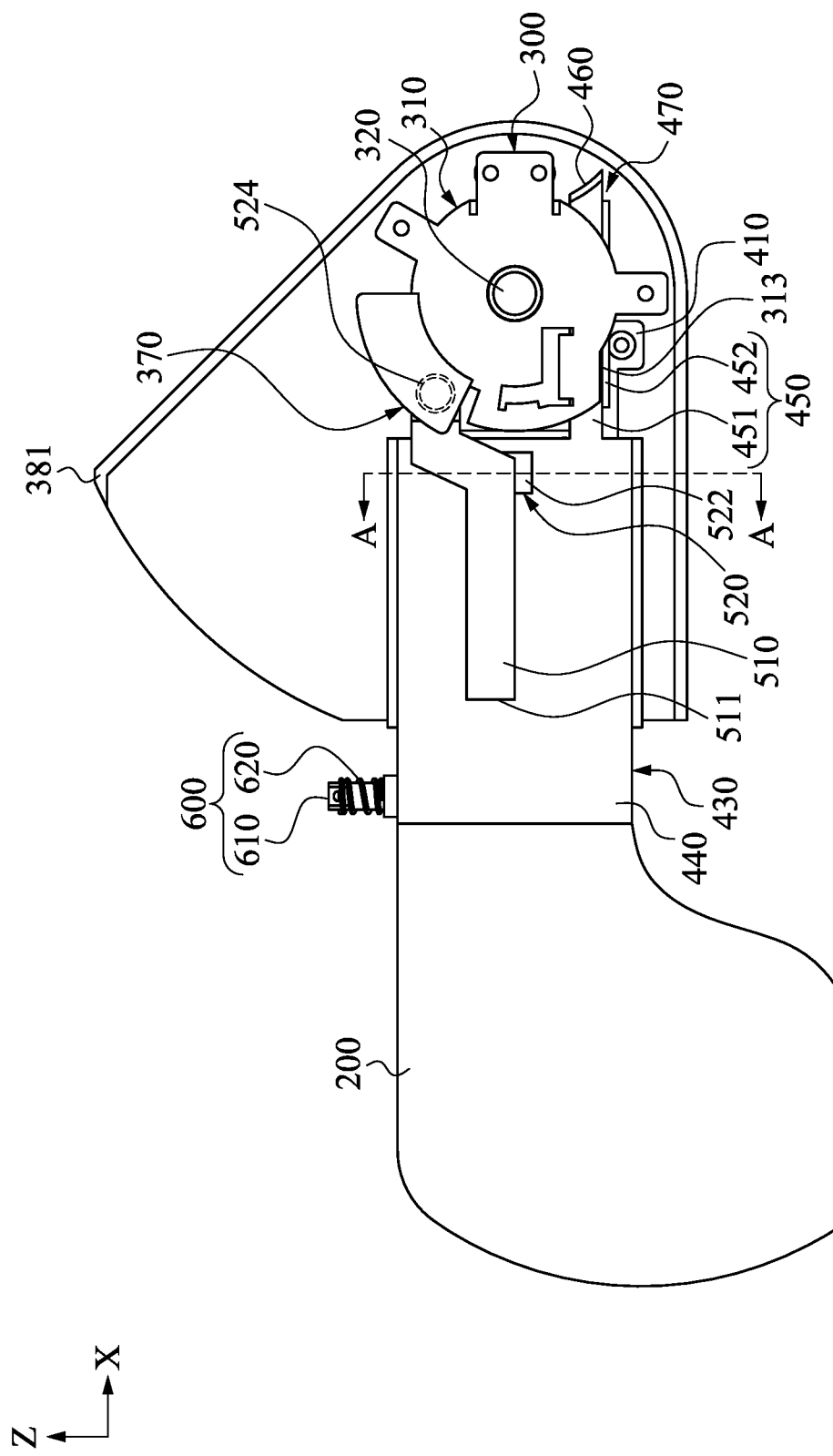
FIG. 4 is an assembly view of FIG. 2.

Reference is now made to FIG. 2 to FIG. 4, in which FIG. 2 is an exploded view of the connecting rod module 400 and the fixing rack 300 of FIG. 1 viewed from one perspective, FIG. 3 is an exploded view of the connecting rod module 400 and the fixing rack 300 of FIG. 1 viewed from another perspective. FIG. 4 is an assembly view of FIG. 2. As shown in FIG. 2 to FIG. 4, in the embodiment, specifically, the fixing rack 300 is provided with a rack body 310, a pivot portion 320, a first arc-shaped rib 330 and a second arc-shaped rib 340. The rack body 310 is provided with a first surface 311 and a second surface 312. The pivot portion 320 is protrusively formed on the first surface 311 of the rack body 310, and the pivot portion 320 is pivotally connected to the support arm 410, thus, the support arm 410 is allowed to rotate about an axial direction (e.g., Y-axis direction) of the pivot portion 320 relative to the fixing rack 300. The first arc-shaped rib 330 and the second arc-shaped rib 340 are collectively formed on the first surface 311 of the rack body 310. Exemplarily, the first arc-shaped rib 330, the second arc-shaped rib 340 and the first surface 311 of the rack body 310 collectively form an arc recess 350. In details, the first arc-shaped rib 330 is disposed on an outer edge of the rack body 310, and extends outwards from the first surface 311 of the rack body 310. The second arc-shaped rib 340 is disposed between the first arc-shaped rib 330 and the pivot portion 320, extends towards the axial direction (e.g., Y-axis direction) of the pivot portion 320, and is less than the first arc-shaped rib 330 in length.

It has to be noted, refer to FIG. 1 and FIG. 2, when the head-mounted display device 10 is used on the user, the sliding member 430 is overlapped with the support arm 410, that is, the sliding member 430 has not yet been slid away from the fixing rack 300.

Specifically, refer to FIG. 1, the fixing rack 300 further includes a first outer frame 381 and a second outer frame 382. The first outer frame 381 is closer to the human head H of the user than the second outer frame 382, and the first outer frame 381 is fixedly connected to the wearable device 100. The first outer frame 381 and the second outer frame 382 are combined with each other so as to form an accommodation space 383. The first outer frame 381 and the second outer frame 382 are able to assemble to each other to form an accommodation space 383 between the first outer frame 381 and the second outer frame 382. The accommodation space 383 is used to accommodate the rack body 310, the support arm 410, and the sliding member 430. The rack body 310 is fixedly connected on the first outer frame 381. The first surface 311 of the rack body 310 is oriented to the first outer frame 381, and the second surface 312 is oriented to the second outer frame 382.

The sliding member 430 includes a frame body 440, an extending arm 450 and a guiding block 460. One end of the extending arm 450 is connected to the frame body 440, and the other end of the extending arm 450 is connected to the guiding block 460. In other words, the extending arm 450 is disposed between the frame body 440 and the guiding block 460. The extending arm 450 has a longitudinal direction (e.g., X-axis direction), and the longitudinal direction (e.g., X-axis direction) is orthogonal to the axial direction (e.g., Y-axis direction) of the pivot portion 320. The extending arm 450 is disposed between the fixing rack 300 and the support arm 410, and is slidably disposed on the bottom portion 313 of the rack body 310. In one embodiment, the extending arm 450 is slidably connected a bottom portion 313 of the first arc-shaped rib 330.

More specifically, the extending arm 450 further includes a plate body 451 and a side rib 452. Two opposite ends of the plate body 451 are directly connected to the frame body 440 and the guiding block 460, respectively. The side rib 452 is interposed between the frame body 440 and the guiding block 460, directly connected a lower long side of the plate body 451, and protrudes in a direction of the plate body 451 facing away from the support arm 410. Furthermore, the length of the plate body 451 is greater than the length of the side rib 452 so that a gap 470 is defined between the side rib 452 and the guiding block 460. The frame body 440 is connected to the display module 200, and more specifically, the frame body 440 is fixedly connected to the display module 200. In the present embodiment, the frame body 440, the extending arm 450 and the guiding block 460 are integrally formed and made of metal.

It has to be noted, when the sliding member 430 is overlapped with the support arm 410, as shown in FIG. 4, the side rib 452 of the extending arm 450 is located at the bottom portion 313 of the rack body 310, and the guiding block 460 of the sliding member 430 is located at one side of the fixing rack 300 opposite to the frame body 440.

In addition, the sliding member 430 further includes two guiding rail portions 480. The guiding rail portions 480 are respectively disposed on two opposite sides of the frame body 440. Each of the guiding rail portions 480 is formed with a guiding slot 481. The guiding slots 481 of the guiding rail portions 480 are facing to each other that the support arm 410 is allowed to be slidably coupled within the guiding slots 481. Thus, the support arm 410 and the sliding member 430 can slide relative to each other. In this embodiment, the guiding rail portions 480 integrally bind on opposite sides of the frame body 440, and the guiding rail portions 480 is different to the frame body 440 in materials. For example, the hardness of the guiding rail portions 480 is less than the hardness of the frame body 440, and each of the guiding rail portions 480 includes a high self-lubricating plastic, that is, the plastic material has lower coefficient of friction.

Specifically, as shown in FIG. 1, the display module 200 includes an outer cover 210 and a screen portion 220. The screen portion 220 is located inside the outer cover 210. When the outer cover 210 of the display module 200 covers the human eyes, the screen portion 220 coaxially provides a display image to the human eyes. However, the disclosure is not limited to the above limitations.

The wearable device 100 includes a fixed headband 110 and a headband adjustment portion 120. Both two ends of the fixed headband 110 are connected to the outer cover 210 of the display module 200. The fixed headband 110 is used to fit over the human head H of the user. The headband adjustment portion 120 is connected to the fixed headband 110, and the length of the fixed headband 110 can be adjusted according to the size of the user's head. However, the disclosure is not limited thereto. In other embodiments, the wearable device 100 is not limited to conventional types such as an elastic band type, a helmet type, a type of hook and loop fastener or a hoop type.

Figure 5:
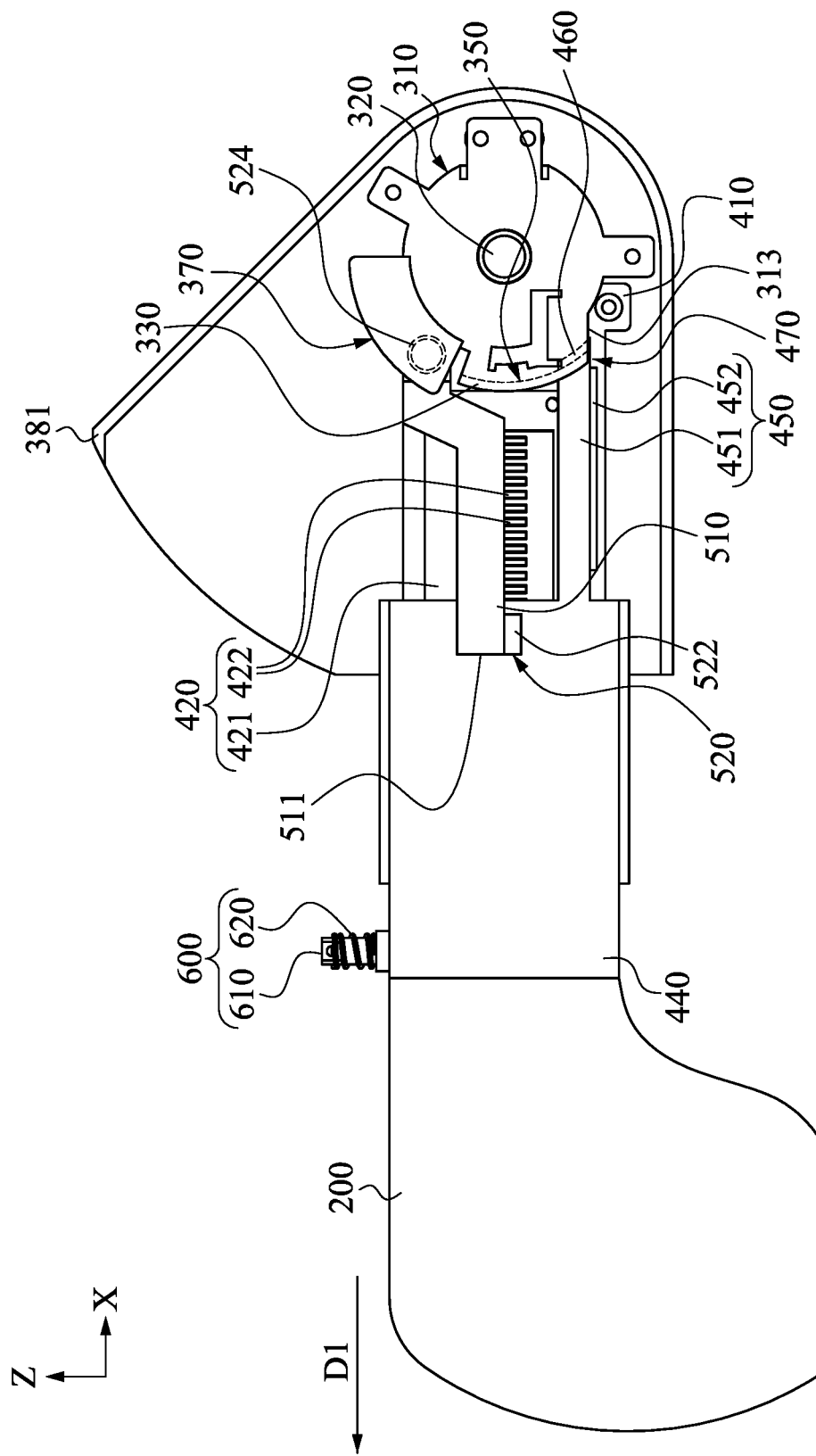
FIG. 5 is a schematic operational view of a display module being laterally slid.
Figure 6:
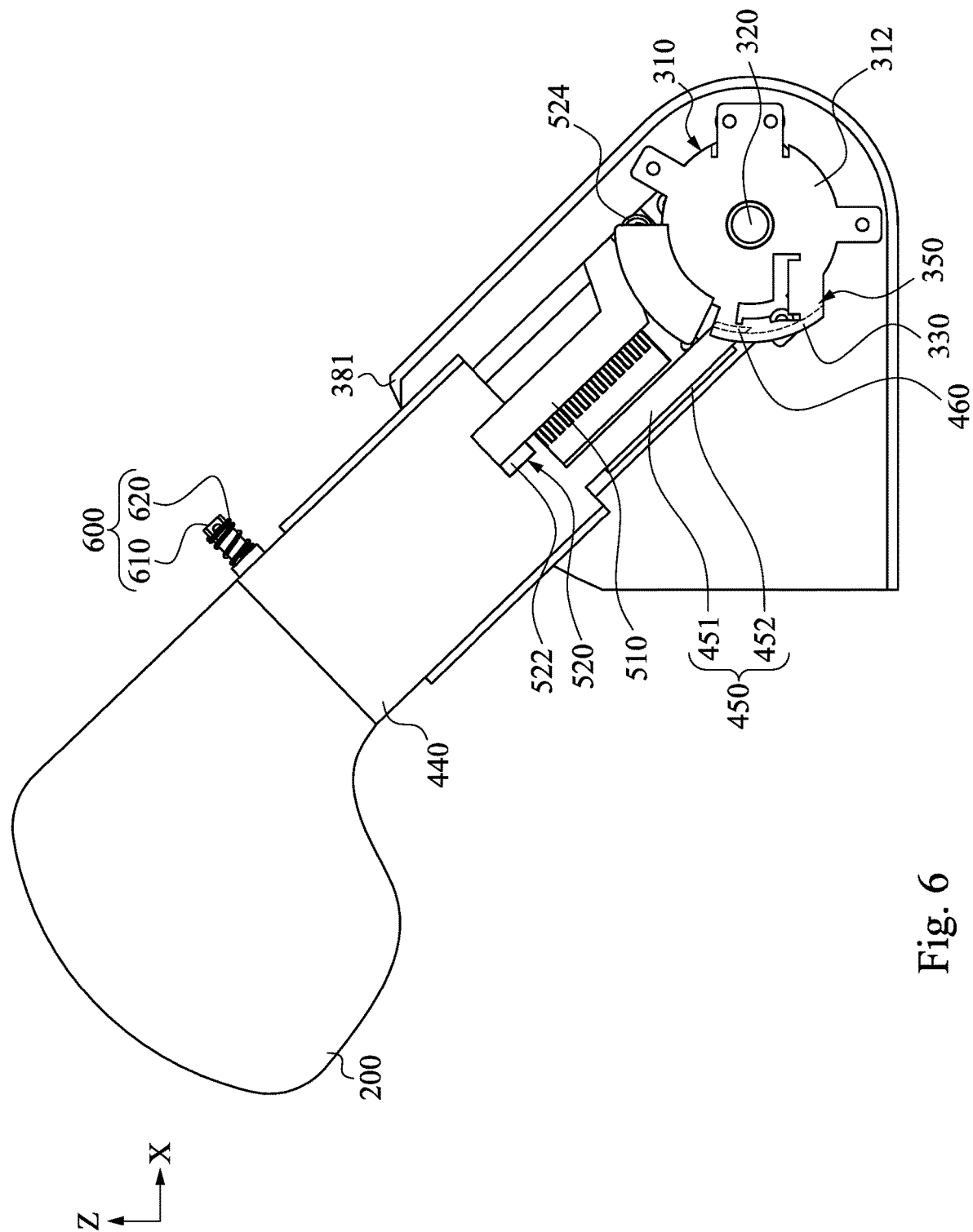
FIG. 6 is a schematic operational view of a display module being rotated upwardly.

FIG. 5 is a schematic operational view of a display module 200 being laterally slid, and FIG. 6 is a schematic operational view of a display module 200 being rotated upwardly. As shown in FIG. 4 and FIG. 5, when the user would change the sight line of the user from the virtual vision field to the real vision field, the user first laterally or horizontally pulls the sliding member 430 in a direction D1 facing away from the fixing rack 300 so that the guiding block 460 of the extending arm 450 can be moved to the arc recess 350 from the bottom portion 313 of the rack body 310; next, as shown in FIG. 4 and FIG. 6, since the bottom of the first arc-shaped rib 330 no longer stops the side rib 452 of the extending arm 450, the display module 200 can be rotated upwardly by the connecting rod module 400.

For example, but not limited to, the connecting rod module 400 further includes a torsion spring element 390. The torsion spring element 390 is sleeved on the pivot portion 320, and two ends of the torsion spring element 390 respectively abut against the fixing rack 300 and the support arm 410 for elastically driving the connecting rod module 400 and the display module 200 to rotate. Therefore, when the bottom of the first arc-shaped rib 330 no longer stops the side rib 452 of the extending arm 450, the torsion spring element 390 automatically rotates the connecting rod module 400 and the display module 200 relative to the fixing rack 300. However, one with ordinary skill in the art of the disclosure may select the resilient capability or the types of the torsion spring element 390 in accordance with demands or restrictions.

It has to be noted, as shown in FIG. 4, when the sliding member 430 is overlapped with the support arm 410, and the sliding member 430 has not yet been slid away from the fixing rack 300, because the extending arm 450 is located at the bottom portion 313 of the rack body 310, for example, the side rib 452 is stopped by the bottom of the rack body 310, the sliding member 430 cannot be rotated immediately with the support arm 410, and can be laterally moved in the longitudinal direction (e.g., X-axis direction) of the extending arm 450 instead.

As shown in FIG. 5, once the sliding member 430 is laterally slid away from the fixing rack 300 such that the guiding block 460 is moved into the arc recess 350, and the bottom portion 313 of the first arc-shaped rib 330 is oriented to the aforementioned gap 470, since the bottom portion 313 of the first arc-shaped rib 330 cannot stop the sliding member 430 from moving, the connecting rod module 400 can be moved to rotate the display module 200 relative to the fixing rack 300 at this moment (FIG. 6), thereby rotating the display module 200 away from the human eye. In other words, before the sliding member 430 is pulled to slide laterally, the user cannot push the display module 200 to rotate. Furthermore, when the connecting rod module 400 moves the display module 200 to rotate relative to the fixing rack 300, since the guiding block 460 rotating within the arc recess 350 is stopped by the first arc-shaped rib 330, the sliding member 430 excessive lateral sliding to be detached from the fixing rack 300 can be avoided.

Also, for example, the fixing rack 300 is further provided with a stopping flange 360 that is protrusively formed on the first surface 311 of the rack body 310. The support arm 410 is further provided with an extending rib 411 that extends towards the fixing rack 300 in a direction (e.g., Y-axis direction), and interposed between the first arc-shaped rib 330 and the pivot portion 320. Thus, when the connecting rod module 400 is rotated at a certain angle relative to the fixing rack 300, the stopping flange 360 substantially interferes with the extending rib 411 for stopping the connecting rod module 400 to continually drive the display module 200 to pivot so that the display module 200 can be prevented from being excessively rotated to damage the connecting rod module 400.

As shown in FIG. 2 and FIG. 3, the connecting rod module 400 includes an engaging element 420 and a depressing component 500. The engaging element 420 includes a strip body 421 and a plurality of position-limited teeth 422. The strip body 421 is fixedly connected to one surface of the support arm 410 facing towards the sliding member 430. The position-limited teeth 422 are spaced arranged on the strip body 421 in an arrangement direction (e.g., X-axis direction) which is parallel to a longitudinal direction (e.g., X-axis direction) of the extending arm 450.

The depressing component 500 includes a suspending arm 510, a pressing block 520 and an elastic member 524. One end of the suspending arm 510 is connected to the support arm 410, and the other end of the suspending arm 510 is a free end 511. The pressing block 520 is connected to the sliding member 430, slidably disposed between the engaging element 420 and the suspending arm 510. Furthermore, the frame body 440 further includes a through hole 441 that is aligned to at least one of the position-limited teeth 422 of the engaging element 420. The pressing block 520 is formed with an engagement interface 521 and a sliding surface 522 at two opposite surfaces thereof. The sliding surface 522 of the pressing block 520 is directly contacted with one surface of the suspending arm 510 facing towards the engaging element 420, and can be reciprocated to slide along the aforementioned surface of the suspending arm 510. The engagement interface 521 includes, for example, one or two teeth. The pressing block 520 extends into the through hole 441, and the engagement interface 521 (e.g., tooth piece) of the pressing block 520 facing towards the position-limited teeth 422 located within the through hole 441. Two opposite ends of the elastic member 524 respectively abut against the suspending arm 510 and the fixing rack 300. For example, the first surface 311 of the rack body 310 is further formed with a sunken portion 370, and one end of the elastic member 524 is slidably contacted with a bottom surface of the sunken portion 370. When the connecting rod module 400 moves the display module 200 to rotate, the elastic member 524 slides along the sunken portion 370.

Thus, when the suspending arm 510 presses the pressing block 520 such that the engagement interface 521 of the pressing block 520 and the position-limited teeth 422 which is located within the through hole 441 are engaged with each other, the sliding member 430 can be temporarily fixed to the support arm 410. On the contrary, when the pressing block 520 is no longer engaged with the position-limited teeth 422 within the through hole 441, the frame body 440 can be linearly moved relative to the support arm 410, so that the sliding surface 522 of the pressing block 520 can slide on the surface of the suspending arm 510.

It has to be noted, when the sliding member 430 is overlapped with the support arm 410, as shown in FIG. 4, the sliding surface 522 of the pressing block 520 is moved away from the free end 511 of the suspending arm 510; when the sliding member 430 is laterally slid, as shown in FIG. 5, the sliding surface 522 of the pressing block 520 is arrived at the free end 511 of the suspending arm 510.

As shown in FIG. 2 and FIG. 3, the connecting rod module 400 further includes a release member 600. The release member 600 includes a pushing member 610 and a returning member 620. The pushing member 610 is movably disposed on the sliding member 430 for pushing the engagement interface 521 of the pressing block 520 away from the engaging element 420. The returning member 620 abuts against the pushing member 610 and the sliding member 430, respectively for returning the pushing member 610 to the original position. More specifically, one end of the pushing member 610 is provided with a first guiding inclined surface 611. One end of the pressing block 520 is provided with a second guiding inclined surface 523. The second guiding inclined surface 523 is cooperatively connected to the first guiding inclined surface 611 and the second guiding inclined surface 523 slidably contacts with the first guiding inclined surface 611 directly.

Figure 7:
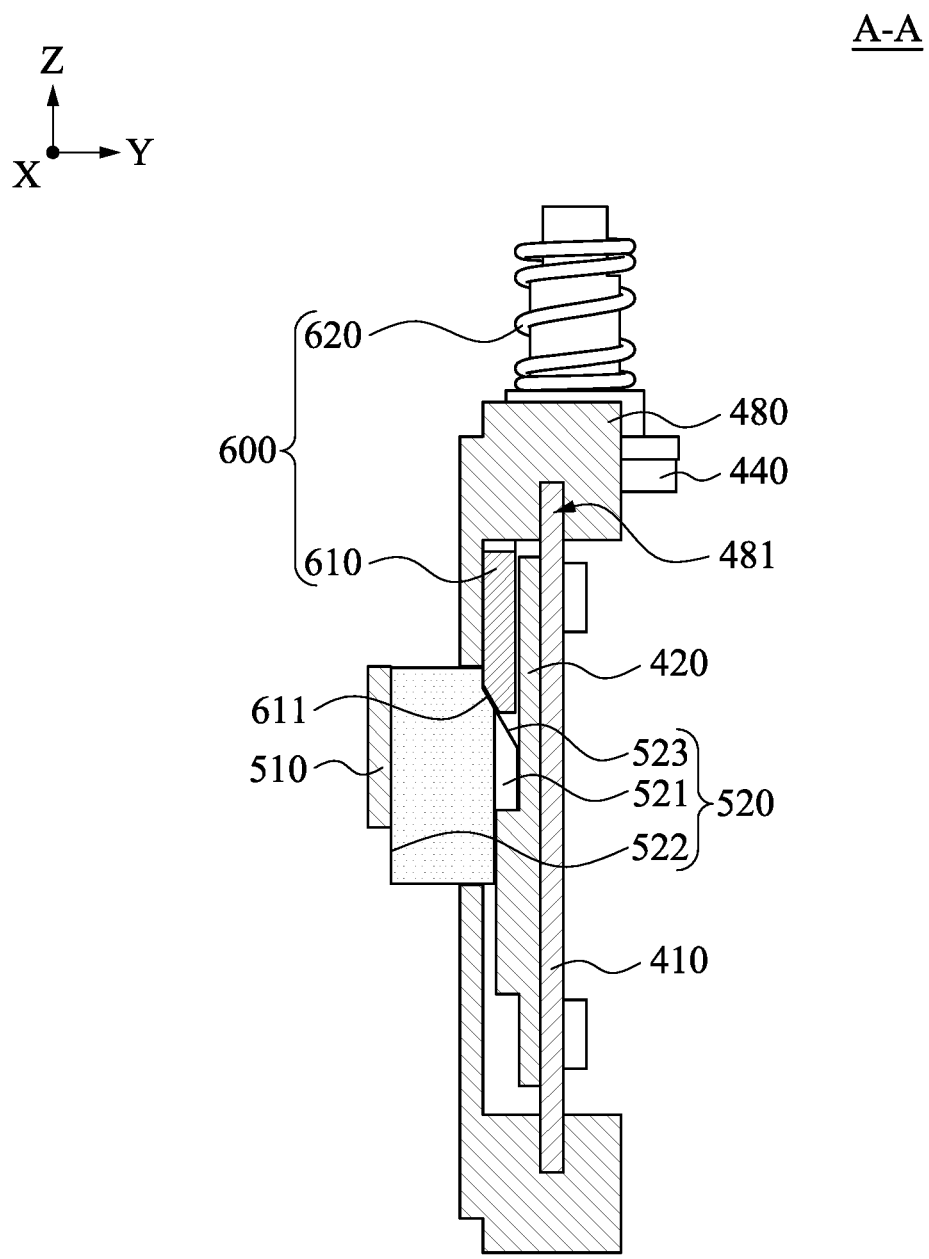
FIG. 7 is a cross-sectional view of the head-mounted display device along line A-A of FIG. 4.
Figure 8:
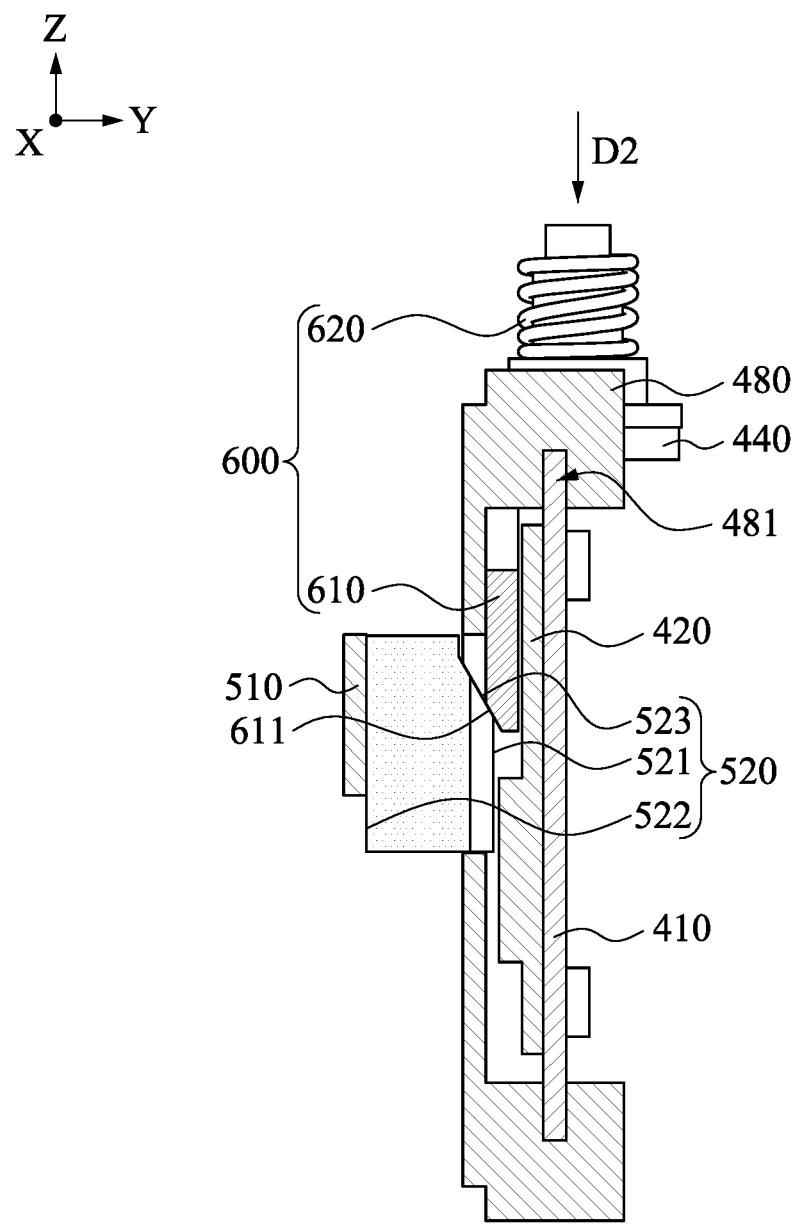
FIG. 8 is a schematic operational view as the release member of FIG. 4 is triggered.

FIG. 7 is a cross-sectional view of the head-mounted display device along line A-A of FIG. 4, and FIG. 8 is a schematic operational view as the release member 600 of FIG. 4 is triggered. As shown in FIG. 7, when the user presses the pushing member 610 downward in a direction D2 to deform the returning member 620, the engagement interface 521 of the pressing block 520 is pushed away from the engaging element 420 in a direction (e.g., Y-axis direction) through the second guiding inclined surface 523 being pushed by the first guiding inclined surface 611. On the contrary, as shown in FIG. 8, when the user no longer presses the pushing member 610, the elastic member 524 returns the suspending arm 510 to the original position, that is, the engagement interface 521 of the pressing block 520 can be engaged with the position-limited teeth 422 in the through hole 441. At the same moment, the returning member 620 also returns the pushing member 610 to the original position so that the pushing member 610 is ready to be pressed again.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A head-mounted display device, comprising:
   a wearable device;
   a display module;
   a fixing rack that is fixedly connected to the wearable device, and provided with a rack body, a pivot portion and a first arc-shaped rib, and the pivot portion is disposed on one surface of the rack body, and the first arc-shaped rib is disposed on an edge of the rack body, and extends outwards from the surface of the rack body; and a connecting rod module comprising a support arm and a sliding member, the support arm that is pivotally connected to the fixing rack, the sliding member that is fixedly connected to the display module, and slidably engaged with the support arm and the fixing rack, and the pivot portion is pivotally connected to the support arm, the sliding member comprises a frame body and an extending arm, the frame body is connected to the display module and the extending arm, and the extending arm is disposed between the fixing rack and the support arm, and slidably connected to a bottom portion of the first arc-shaped rib, and the first arc-shaped rib is configured to stop the connecting rod module from rotating relative to the pivot portion.

2. The head-mounted display device of claim 1, wherein the fixing rack is further provided with a second arc-shaped rib that is disposed on the surface of the rack body between the first arc-shaped rib and the pivot portion, the rack body, the first arc-shaped rib and the second arc-shaped rib collectively form an arc recess, and the sliding member comprises a guiding block that is disposed on one end of the extending arm opposite to the frame body, wherein, when the frame body is slid away from the fixing rack to move the guiding block into the arc recess, the connecting rod module is able to rotate relative to the fixing rack.

3. The head-mounted display device of claim 1, wherein the connecting rod module comprises:

an engaging element comprising a strip body and a plurality of position-limited teeth, the strip body is fixedly connected to the support arm, the position-limited teeth are spaced arranged on the strip body in a longitudinal direction of the extending arm; and a depressing component, comprising:
 a suspending arm that is connected to the support arm; and
 a pressing block that is connected to the sliding member, slidably disposed between the engaging element and the suspending arm, and the pressing block is provided with an engagement interface,
 wherein, when the suspending arm presses the engagement interface of the pressing block to be engaged with at least one of the plurality of position-limited teeth, the sliding member is fixed to the support arm.

4. The head-mounted display device of claim 3, wherein the rack body further comprises a sunken portion at the surface of the rack body, and the depressing component further comprises an elastic member that abuts against the sunken portion and the suspending arm, respectively, wherein, when the connecting rod module moves the display module to rotate relative to the fixing rack, the elastic member slides along the sunken portion.

5. The head-mounted display device of claim 3, wherein the connecting rod module comprises:

a release member comprising a pushing member and a returning member, the pushing member movably disposed on the sliding member for pushing the engagement interface of the pressing block away from the engaging element, and the returning member abutting against the pushing member and the sliding member, respectively.

6. The head-mounted display device of claim 4, wherein one end of the pushing member is provided with a first guiding inclined surface, and one end of the pressing block is provided with a second guiding inclined surface that is matched to the first guiding inclined surface and slidably contacts with the first guiding inclined surface directly, wherein the engagement interface of the pressing block is pushed away from the engaging element through the first guiding inclined surface pushing the second guiding inclined surface.

7. The head-mounted display device of claim 1, wherein the sliding member further comprises:

at least one guiding rail portion that is disposed on one side of the frame body, and formed with a guiding slot for the support arm slidably engaging within the guiding slot.

8. The head-mounted display device of claim 1, wherein the connecting rod module comprises:

a torsion spring element that is sleeved on the pivot portion to respectively abut against the fixing rack and the support arm for elastically driving the connecting rod module and the display module to rotate.

9. The head-mounted display device of claim 1, wherein the support arm is further provided with an extending rib that extends towards the fixing rack, and the fixing rack is further provided with a stopping flange that is protrusively formed on the surface of the rack body, wherein, when the connecting rod module is rotated at a certain angle relative to the fixing rack, the stopping flange interferes with the extending rib for stopping the connecting rod module to continually drive the display module to pivot.

* * * * *